United States Patent
Bodager et al.

[11] Patent Number: 5,534,380
[45] Date of Patent: Jul. 9, 1996

[54] PROCESS OF FORMING A COLORED IMAGE UTILIZING AQUEOUS-PROCESSABLE IMAGING ELEMENT TONABLE AT ROOM TEMPERATURE BEFORE AND AFTER EXPOSURE TO ACTINIC RADIATION

[75] Inventors: Gregory A. Bodager, Monroeton, Pa.; Bruce M. Monroe, Wilmington, Del.

[73] Assignee: E. I. Du Pont de Nemours and Company, Wilmington, Del.

[21] Appl. No.: 345,175

[22] Filed: Nov. 28, 1994

Related U.S. Application Data

[62] Division of Ser. No. 196,881, Feb. 15, 1994, Pat. No. 5,401,603, which is a continuation of Ser. No. 805,669, Dec. 12, 1991, abandoned.

[51] Int. Cl.⁶ .................................................... G03F 7/11
[52] U.S. Cl. .................. 430/143; 430/144; 430/257; 430/291; 430/292; 430/293
[58] Field of Search ................... 430/143, 144, 430/157, 158, 162, 167, 291, 292, 293, 271, 273, 257

[56] References Cited

U.S. PATENT DOCUMENTS

| | | | |
|---|---|---|---|
| 3,694,203 | 9/1972 | Okubo et al. | 430/144 |
| 3,811,882 | 5/1974 | Henry | 430/293 |
| 4,272,620 | 6/1981 | Ichimura | 525/61 |
| 4,396,700 | 8/1983 | Kitajima et al. | 430/143 |
| 4,510,226 | 4/1985 | Morishita et al. | 430/144 |
| 4,537,851 | 8/1985 | Nonagaki et al. | 430/144 |
| 5,028,512 | 7/1991 | Hagatani | 430/300 |
| 5,229,244 | 7/1993 | Hertler et al. | 430/176 |

FOREIGN PATENT DOCUMENTS

| | | |
|---|---|---|
| 0266069 | 5/1988 | European Pat. Off. |
| 0353666 | 2/1990 | European Pat. Off. |
| 1191659 | 5/1970 | United Kingdom |
| 1413583 | 11/1975 | United Kingdom |
| 92/02857 | 2/1992 | WIPO |

*Primary Examiner*—Charles L. Bowers, Jr.
*Assistant Examiner*—Christopher G. Young

[57] ABSTRACT

A tonable, aqueous-processable, photosensitive element and process for forming a colored image from said element is described. The element comprises a support and a tonable, aqueous-processable photosensitive layer, said photosensitive layer consisting essentially of (a) an aqueous-processable, photoinsolubilizable photosensitive composition comprising a photosensitive material, and (b) a water-soluble plasticizer, wherein said photosensitive material is present in sufficient amount to insolubilize said photosensitive layer on exposure to actinic radiation, said photosensitive composition is present in sufficient amount to form a layer when said photosensitive layer is coated, and said plasticizer is present in sufficient amount to make said photosensitive layer.

14 Claims, No Drawings

PROCESS OF FORMING A COLORED IMAGE UTILIZING AQUEOUS-PROCESSABLE IMAGING ELEMENT TONABLE AT ROOM TEMPERATURE BEFORE AND AFTER EXPOSURE TO ACTINIC RADIATION

This is a division of application Ser. No. 08/196,881, filed Feb. 15, 1994, now U. S. Pat. No. 5,401,603 which is a continuation of 07/805,669 filed Dec. 12, 1991 now abandoned.

FIELD OF THE INVENTION

This invention relates to photosensitive elements and a process for image reproduction. More particularly it relates to aqueous-processable, tonable, photosensitive elements comprising a support and a photosensitive layer provided thereon.

BACKGROUND OF THE INVENTION

Photosensitive elements are used in image-reproduction processes and are well-known in the graphic arts industry. These elements are usually exposed to actinic radiation through an image-bearing transparency, such as a color separation transparency, to produce an image which is either a positive or negative with respect to the transparency used. Positive-working photosensitive elements are described in Chu and Cohen, U.S. Pat. No. 3,649,268 and negative-working photosensitive elements are described in Chu and Fan, U.S. Pat. Nos. 4,174,216 and 4,191,572. Negative-working elements produce an image that is the reverse of the transparency through which they are exposed. That is, the colored regions of the transparency are uncolored in the imaged element and the uncolored regions in the transparency are colored in the imaged element. Positive-working elements produce an image which is a duplicate of the transparency through which they are exposed. That is, the colored regions of the transparency are also colored in the imaged element and the uncolored regions in the transparency are uncolored in the image element. After imagewise exposure, the photosensitive elements may be developed by (a) washout of soluble image areas, (b) peeling apart, (c) toning with a colorant, or (d) combinations of these techniques.

Photosensitive elements are widely used in off-press color proofing to simulate the images produced by printing. Off-press color proofs include overlay systems and surprint, or single sheet systems. In an overlay proof, each colored image is on a separate transparent support sheet. The individual films are assembled in register and viewed as a composite against an appropriate background, e.g., an opaque reflective white sheet. In an overlay system, the individual colored images remain separable and can be combined separately. In a surprint proof, all of the colored images are superposed by, for example, multiple exposure, lamination, or transfer, on a single support. The colored images can not be separated and viewed individually.

Many conventional proofing films are precolored by their manufacturers. Thus, in the preparation of images from precolored proofing films, the operator is limited to those colors provided by the manufacturer. In addition, the cost of manufacture and distribution allows only a limited range of colors to be available.

It has been found that greater color flexibility can be attained from tonable elements. The operator can mix the toners supplied by the manufacturer as desired, and thus, toned images with an almost unlimited variety of colors can be prepared. Instead of many specialty films, the manufacturer need only supply a single, non-colored, tonable element.

Following imagewise exposure, tonable photosensitive elements typically are developed by washing out the unexposed areas of the photosensitive layer with a suitable solvent. Many of these elements require washout with an organic solvent which is disadvantageous for environmental and safety reasons. For example, Fan, U.S. Pat. No. 4,053,313 discloses a photosensitive element comprising a solvent-processable photosensitive layer, a tonable elastomeric layer, and a support, that is washed-out by a mixture of water and organic solvent. Similarly, the elements disclosed in Speckler, U.S. Pat. Nos. 4,376,158 and 4,376,159, require aqueous base for washout. The use of organic solvents is frequently undesirable because of flammability, toxicity, and waste disposal considerations. The use of aqueous base is also undesirable because of toxicity, waste disposal, and corrosion problems. Thus, there continues to be a need for improved tonable, photosensitive elements that can be processed in aqueous solvents, preferably with ordinary tap water.

SUMMARY OF THE INVENTION

The invention describes a process for forming a colored image comprising the steps of:
 (A) imagewise exposing a tonable photosensitive element comprising:
  (1) a support, and
  (2) a tonable aqueous-processable photosensitive layer, consisting essentially of:
   (a) an aqueous-processable, photoinsolubilizable, photosensitive composition comprising a photosensitive material, and
   (b) a water-soluble plasticizer, wherein said photosensitive material is present in sufficient amount to insolubilize said photosensitive layer on exposure to actinic radiation, said photosensitive composition is present in sufficient amount to form a layer when said photosensitive layer is coated, and said plasticizer is present in sufficient amount to make said photosensitive layer tonable;
 (B) washing out the unexposed regions of the photosensitive layer with an aqueous solvent; and
 (C) applying a colorant to the photosensitive layer; wherein step (A) is carried out before step (B).

Step (C) may be carried out before step (A), between steps (A) and (B), or following step (B). In a preferred embodiment, step (C) is carried out between steps (A) and (B).

In another preferred embodiment, the aqueous-processable photosensitive material is selected from the group consisting of photosensitive, aqueous-processable polymeric diazo resins; photosensitive, aqueous-processable bis-azides; and photosensitive, aqueous-processable derivatives of polyvinyl alcohol wherein said polyvinyl alcohol derivative comprises photocrosslinkable groups.

DETAILED DESCRIPTION OF THE INVENTION

The invention describes a tonable, photosensitive element comprising a solid, tonable, aqueous-processable photosensitive layer and a support and a process for forming a colored image from such an element.

Photosensitive Layer

Surprisingly and unexpectedly it was found that a photosensitive layer consisting essentially of an aqueous-processable, photoinsolubilizable, photosensitive composition comprising a photosensitive material and a water-soluble plasticizer could be applied to a support to produce a water-developable, photosensitive element which is then toned to provide color.

The term "photoinsolubilizable" as used herein shall mean having the ability to change from a soluble state to an insoluble state upon irradiation. Thus, before exposure to actinic radiation, the photosensitive composition is removable from the support by water or by aqueous solutions which consist essentially of water. After exposure, the composition is not removable from the support by water or by aqueous solutions which consist essentially of water.

The photosensitive composition may also comprise a water soluble binder. In addition, conventional additives may be present in the photosensitive layer.

Photosensitive Material

The photosensitive material insolubilizes the photosensitive composition on exposure to actinic radiation. Preferred photosensitive materials include (1) polymeric diazo resins; (2) bis-azides; and (3) derivatives of polyvinyl alcohol wherein the polyvinyl alcohol derivative comprises photocrosslinkable groups.

Photoinsolubilization can be achieved by the photoinitiated reaction of a preformed, essentially non-photosensitive binder with a separate polyfunctional photoactivatable crosslinking agent. Photoinsolubilization can also be achieved by the photoinitiated reaction of photoreactive crosslinking groups attached directly to a preformed polymer. In either case, the resulting change in physical properties of the preformed polymer, particularly the increase in molecular weight and/or network formation, insolubilizes the photosensitive composition.

Typical polyfunctional photoactivatable crosslinking agents are dichromate and diazides. Upon irradiation, these materials form intermediates that react with two polymer chains, and/or with each other, to form a network. Dichromated colloids, such as dichromated gelatin, are well known photocrosslinkable materials.

A preferred class of polyfunctional photoactivatable crosslinking agents are bis-azides. Generally these compounds are aromatic bis-azides substituted with one or more ionic groups, such as sulfonate, carboxylate, sulfate, etc., to increase water solubility. Typical bis-azides are sodium 4,4'-diazidostilbene-2,2'-disulfonate, sodium 4,4'-diazidostilbenzalacetophenone-2-sulfonate, and sodium 4,4'-diazidostilbene-alpha-carboxylate. A preferred bis-azides is sodium 4,4'-diazidostilbene-2,2'-disulfonate. As will be apparent to those skilled in the art, equivalent results may be obtained from the use of bis-azides which contain other cations in place of sodium, such as, for example, potassium, ammonium, and substituted ammonium, such as, for example, ethyl ammonium, tetramethyl ammonium, etc.

Photosensitive diazo resins are another preferred class of photosensitive materials. These materials typically consist of aromatic diazonium salts crosslinked with formaldehyde. Representative materials are (a) the zinc chloride complex of the 4-(phenylamino)-benzenediazonium sulfate (1:1) formaldehyde polymer, (b) the zinc chloride complex of the 4-(phenylamino)-benzenediazonium phosphate (1:1) formaldehyde polymer, (c) the cobalt chloride complex of the 4-(phenylamino)-benzenediazonium (1:1) formaldehyde polymer, (d) the uncomplexed 4-(phenylamino)benzenediazonium phosphate (1:1) formaldehyde polymer, and (e) the uncomplexed 4-(phenylamino)-benzenediazonium sulfate (1:1) formaldehyde polymer. The uncomplexed 4-(phenylamino)-benzenediazonium phosphate (1:1) formaldehyde polymer and the uncomplexed 4-(phenylamino)-benzenediazonium sulfate (1:1) formaldehyde polymer are preferred because their development does not produce effluent containing heavy metals.

Derivatives of water soluble polymers, such as polyvinyl alcohol, which comprise pendent photocrosslinkable groups can be used in the photosensitive layer. On exposure, these groups react to form crosslinks between different polymer chains. Photocrosslinkable polymers are described in A. Reiser, *Photoreactive Polymers: The Science and Technology of Resists*, Wiley, New York, 1989, pages 24–32. Typical photocrosslinkable groups are, for example, the cinnamyl, chalcone, alpha-phenylmaleimide, N-alkyl styrylpyridinium, and N-alkyl styrylquinolinium groups.

Derivatives of polyvinyl alcohol which comprise photocrosslinkable groups are preferred photocrosslinkable polymers. Preferred polyvinyl alcohol derivatives are those which comprise N-alkyl styrylpyridinium or N-alkyl styrylquinolinium groups. Such polymers are described in K. Ichimura and S. Wantanabe, *J. Polym. Sci. Polym. Lett. Eds.* 18, 613 (1980) and 20, 1411, 1419 (1982) as well as in Ichimura, U.S. Pat. Nos. 4,272,620, 4,287,335, 4,339,524, 4,564,580 and 4,777,114. The disclosure of these references is incorporated herein by reference.

Substituted aqueous-processable polyvinyl alcohol polymers are typically prepared by derivatization of saponified polyvinyl acetate with the appropriate photocrosslinking group. It is desirable for the polyvinyl acetate to be at least 70% hydrolyzed. Typically 88% saponified polyvinyl acetate is used, but polyvinyl acetate which is more or less highly saponified can be used provided the photosensitive layer is aqueous-processable. The photocrosslinkable group can be attached to the polyvinyl alcohol by any appropriate chemical linkage, such as an ester, ether, or acetal linkage. The acetal linkage is preferred. Typically 0.5–10 mol% photocrosslinkable groups, preferably 1–4 mol%, are present. Although polymers containing higher amounts of photocrosslinkable groups typically are not aqueous-processable, higher amounts of photocrosslinkable groups can be used, provided the photosensitive layer is aqueous-processable. The degree of polymerization of the polyvinyl alcohol, i.e., the number of monomer units in the polymer chain, is advantageously in the range of 400 to 3,000. A low degree of polymerization, i.e., polymerization less than 400, requires a longer exposure time to obtain insolubilization. A high degree of polymerization, i.e., polymerization greater than 3,000, causes the viscosity of solutions containing the polymer to become so large that they are difficult to prepare and handle.

Binder

If a relatively low molecular weight polyfunctional photoactivatable crosslinking agent is used in the photosensitive composition, addition of a preformed, essentially non-photosensitive polymer, or binder, to the photosensitive composition may be necessary for the photosensitive composition to be film forming. The binder serves as a matrix for the photosensitive material and plasticizer prior to exposure and contributes to the physical properties of the photosensitive layer, both before and after exposure.

The binder must be water-soluble or at least aqueous-processable, that is, capable of being removed from the support by either water or solutions which consist essentially of water. It must also be tonable when plasticized. The binder must be compatible with the other components of the photosensitive composition system, i.e., there should be no evidence of phase separation, such as haze when the photosensitive layer is coated. It should be of sufficient molecular weight, have a sufficiently high glass transition temperature, and be present in a sufficient amount that a substantially solid layer, or film, is formed when the photosensitive layer is coated.

Typical binders are water-soluble, film forming polymers. Preferred binders are polyethylene oxide, polyvinyl alcohol, poly(2-ethyl-2-oxazoline), and polyvinyl pyrrolidone. Polyvinyl alcohol must be sufficiently hydrolyzed so that it is soluble in water. Polyvinyl alcohols which are about 80–100% hydrolyzed are preferred. A molecular weight of about 10,000 to 186,000 is preferred. Polyvinyl pyrrolidone in the molecular weight range of about 10,000 to 360,000 may be used to advantage. Polyvinyl pyrrolidone is discussed in Chapter 21 of *Handbook of Water-Soluble Gums and Resins*, R. L. Davidson, Ed., McGraw-Hill, New York, 1980. Polyethylene oxide is discussed in Chapters 18 and 19 of *Handbook of Water-Soluble Gums and Resins*, R. L. Davidson, Ed., McGraw-Hill, New York, 1980.

Plasticizer

A plasticizer is present in the photosensitive layer to make it tonable. The plasticizer must be compatible with the binder, if present, and the other components of the photosensitive layer, i.e., there should be no evidence of phase separation, such as haze when the photosensitive layer is coated onto the support. In addition, the plasticizer must be water-soluble or at least aqueous-processable. Preferred plasticizers are polyethylene glycol, polypropylene glycol, and poly(vinyl methylether). Those skilled in the art will recognize that binders with low glass transition temperatures can be used as plasticizers and are, therefore, equivalent to plasticizers in the practice of this invention.

Other Ingredients

Conventional additives may be added to the photosensitive layer provided they are (i) compatible with the other ingredients present in the layer, (ii) do not impart unwanted color to the final image, and (iii) do not adversely affect the action of the element required for the operation of the imaging process. Suitable additives include antihalation agents, optical brightening agents, release agents, surfactants, and coating aids.

Composition

The photosensitive material must be present in sufficient amount to insolubilize the photosensitive layer on exposure to actinic radiation. The plasticizer must be present in sufficient amount to make the photosensitive layer tonable, but not in such a large amount that it adversely affects the properties of the photosensitive layer, such as, for example, photospeed, adhesion, etc., needed for the operation of the element. The photosensitive composition must contain sufficient polymer, either as part of the photosensitive material and/or as added binder, to form a film when coated to form the photosensitive layer.

The composition of the photosensitive layer, expressed in percent by weight, is typically 30–70% binder, preferably 40–50%; 1–15% photosensitive material, preferably 4–8%; 30–70% plasticizer, preferably, 40–50%; and 0–2% other ingredients. If no binder is present, the composition is typically photosensitive material 30–80%, preferably 50–60%; 30–70% plasticizer, preferably, 40–50%; and 0–2% other ingredients.

Support/Receptor/Temporary Carrier

The photosensitive layer is present on a support. The support may be any-suitable material which has the necessary stiffness and dimensional stability. Polyethylene terephthalate is preferred. A removable support is required for preparation of a surprint proof. A separate release layer may be situated between the support and the photosensitive layer, or silicon release treated polyethylene terephthalate may be used. Silicon release treated polyethylene terephthalate is preferred for this application.

The receptor may be any material which has the necessary stiffness, dimensional stability, and water resistance. The receptor is flat and preferably smooth and opaque. Exemplary materials which may be used as the receptor include adhesive subbed opaque polyethylene terephthalate film base, such as Melinex®, sold by ICI Americas, Wilmington, Del.; and paper stock treated to make it resistant to aqueous solvents. The preferred material is opaque polyethylene terephthalate film.

A temporary carrier is required when the element is used to prepare an image by the transfer in register process. Materials which may be used as the temporary carrier are the same materials which may used as the receptor.

Manufacture

The element may be prepared by conventional coating techniques. The photosensitive coating is prepared by dissolving the ingredients in water, usually in the weight ratio of about 8 to 92 (solids to water); coating onto the support; and evaporating the water. Coatings should be uniform. A coating weight of about 10–40 mg/dm$^2$ dry coating weight, generally providing a thickness of about 0.5 to 2 microns, is preferred. When an adhesive layer is present, one layer is coated onto the support and dried and the other layer coated on top of it. The adhesive layer is coated from an appropriate solvent, typically at a coating weight of 50–150 mg/dm$^2$. Multilayer coating may also be carried out using conventional multilayer coating techniques. After the solvent has evaporated, a release film, such as polyethylene, may be placed over the photosensitive element as a coversheet to protect it until the element is ready for use.

Exposure/Image Formation

Exposure

Any convenient source providing actinic radiation absorbed by the photosensitive resin can be used to activate the imaging reaction. The term "actinic radiation" means any radiation which produces imaging. The radiation can be natural or artificial, monochromatic or polychromatic, incoherent or coherent. For efficient image formation, most of the actinic radiation should be absorbed by the photosensitive resin. The absorption spectrum of the photosensitive material and of the photosensitive layer may be determined by conventional spectrophotometry.

Conventional sources of actinic radiation include fluorescent, mercury vapor, mercury-xenon, metal additive, and arc lamps. Useful sources of coherent radiation are lasers whose emissions fall within or overlap the absorption bands of the photosensitive resin. Exposure is ordinarily carried out through a halftone image-bearing transparency, preferably a halftone color separation transparency. However, other means, such as a modulated scanning laser beam, CRT (cathode ray tube), and the like, are alternative ways of imagewise exposing the photosensitive elements.

The element is exposed to actinic radiation, typically through a negative separation transparency with the emulsion side of the transparency in contact with the support. If exposure is carried out through the support, the support must be transparent to actinic radiation. To ensure good contact between the transparency and the support, exposure is conveniently carried out in a standard vacuum frame. Alternatively the support may be removed before exposure. This will be necessary if colorant is to be added before exposure. If the support is removed, it is preferred to place a sheet of transparent material, such as polypropylene film, between the separation transparency and the photosensitive layer during exposure. Although exposure is typically through a negative separation transparency, alternative means of exposing the element, as described above, may be used.

Single Colored Image

The photosensitive element may be used to prepare a single color image on the support by (A) exposure to actinic radiation; (B) washout of the unexposed regions with water or an aqueous solvent; and (C) coloring of the photosensitive layer by adding a colorant. Step (A) is carried out before Step (B). Step (C) may be carried out before step (A), between steps (A) and (B), or following step (B). Step (C) is preferably carried out between steps (A) and (B). If Step (C) is carried out first, the colorant may adversely affect resolution and photospeed. If Step (C) is carried out last, the colorant may remain on washed out regions causing stain. Typically, images with greater color density are produced if Step (C) is carried out between Step (A) and Step (B).

It is preferred that colorant be added to the exposed photosensitive layer before washout, however, colorant may be added to the photosensitive layer before exposure or after washout instead. Although certain of the processes for forming images will be described in the order Step (A), Step (C), and Step (B), the processes in which the steps occur in a different order are also possible.

The single color image may be used as an overlay proof provided it is prepared on a transparent support. For example, exposing through a series of different color separation transparencies and toning with the corresponding colorants, a series of differently colored images may be prepared. These colored images are then stacked in register to form a multilayer overlay proof.

Exposure In Register Process

The photosensitive element of the invention may be used to prepare multicolored images by the exposure in register process. To do so, an element comprising a removable support, such as silicon release treated polyethylene terephthalate film, is required. The release film, if present, is removed from the element and the photosensitive layer is laminated to a receptor using an adhesive layer. Following lamination, the element consists of a receptor; an adhesive layer; a photosensitive layer; and a support.

Alternatively, the photosensitive element may comprise an adhesive layer thereby making it unnecessary to add a separate adhesive layer. In this case the photosensitive element comprises, in order support, photosensitive layer, and adhesive layer. The adhesive layer comprises a water-insoluble polymer. The polymer should give a colorless, optically transparent film which can be heat laminated onto a receptor or to the previously formed image. Materials useful for the adhesive layer include polyvinyl acetate and copolymers and terpolymers thereof as well as polyesters and polyamides. Plasticizers and surfactants may also be present in the adhesive layer.

The element is exposed to actinic radiation as described above. The support is removed and the exposed photosensitive layer is colored by addition of a suitable colorant. Colorant may be applied in the form of a toner. Suitable toners are described in Chu et al., U.S. Pat. No. 3,620,726; Gray, U.S. Pat. No. 3,909,282; Manger et al., U.S. Pat. No. 4,215,193; and Ruskin, U.S. Pat. No. 4,661,439. Toners may be applied by (a) dusting with pads dipped in toners as described by Burg et al., U.S. Pat. No. 3,060,024; (b) transfer as described by Burg et al., U.S. Pat. No. 3,060,025; (c) hand-operated machine toning as described by Sandner, U.S. Pat. No. 4,019,821; or (d) automatic toning as described by Tobias, U.S. Pat. No. 4,069,791.

Alternatively, colorant may be applied by laminating precolored transfer films to the exposed photosensitive layers. Such films may be prepared by coating a dispersion of a pigment and a film-forming polymer, such as polyvinyl alcohol, onto a support. Polymer films, such as polyethylene, polypropylene, and polyethylene terephthalate may be used as the support. The film is laminated to the exposed photosensitive layer and the film support removed before washing out the element. The precolored transfer films disclosed in Fröhlich, U.S. Pat. No. 4,806,451, may also be useful.

After addition of the colorant, the exposed photosensitive layer is sprayed with water or an aqueous solvent to remove the non-exposed areas. During washout, the exposed element may be gently brushed or rubbed with cotton. The washed-out element is dried to produce a single color surprint proof which is a negative of the transparency used for exposure.

The support of the first-formed colored image may also be used as the receptor. In this case, it is unnecessary to transfer the photosensitive layer for the first-formed image. A removable support and an adhesive layer are not required for this image.

If a two color surprint image is desired, an adhesive layer and an additional photosensitive element are laminated to the image previously formed to produce an element consisting of: receptor; adhesive layer; first exposed, colored, and washed-out photosensitive layer; adhesive layer; second photosensitive layer; and support. The second photosensitive layer is exposed in register through its corresponding color separation transparency, colored, and washed out as described above to produce a two color surprint proof. To form a multicolor surprint proof, additional photosensitive elements may be laminated to this image, exposed in register through their corresponding color separation transparencies, colored, and washed out. A four-color surprint proof, consisting of yellow, cyan, magenta, and black images, may be formed in this manner. If desired, the image may be covered with a conventional topcoat.

Transfer In Register Process

The photosensitive element of the invention may be used to prepare multicolored images by the transfer in register process. To do so, an element comprising a removable support is required. The element is exposed to actinic radiation, colored, and washed out as described above. The washed out element is dried to produce a single color image consisting of a removable support and a first exposed, colored, and washed out photosensitive layer.

The single color image is transferred to a temporary carrier by laminating the washed out photosensitive layer to the adhesive layer of a temporary carrier comprising a support, a release layer and an adhesive layer. Lamination is carried out with heat and pressure. The removable support is removed to reveal the photosensitive layer and produce an element comprising a temporary carrier and a first exposed, colored, and washed out photosensitive layer. The image thus formed is a wrong-reading, i.e., inverted image.

An adhesive layer is then coated on the element to accept the next exposed and washed out photosensitive layer. Alternatively, the photosensitive element may comprise an adhesive layer which is transferred to the temporary carrier with the exposed and washed out photosensitive layer. In this case the photosensitive element comprises, in order (a) a support, (b) an adhesive layer, and (c) a photosensitive layer.

A second colored image is prepared by removing the release film, if present, from a second element, exposing, coloring, and washing out as described above. The second colored image is laminated in register to the element comprising temporary carrier; first exposed, colored, washed out photosensitive layer; and adhesive layer, and the support removed. Additional elements may be exposed, colored, washed out, transferred in register, and the support removed, to produce a multicolor wrong-reading element on the temporary carrier. The revealed surface of this element is the adhesive layer of the last colored image laminated to the element.

A right-reading multicolored image is obtained by lamination of the revealed adhesive layer onto the desired support, typically the stock which will be used for printing. The temporary carrier is then removed, separating, depending on the position of the release layer on the temporary carrier, either between temporary carrier's release layer and adhesive layer or between the temporary carrier's adhesive layer and the first colored image.

Industrial Applicability

The elements of this invention are useful for preparing colored images. These images are particularly useful in the graphic arts field, especially in the area of color proofing wherein proofs are prepared to duplicate the images produced by printing.

The advantageous properties of this invention can be observed by reference to the following examples which illustrate, but do not limit, the invention.

EXAMPLES

| GLOSSARY | |
|---|---|
| Carbowax ® 200 | Polyethylene glycol (MK 200); Union Carbide, Danbury, CT |
| Cyan Pigment | Sunsperse ® 6000 Phthalo Blue, RS; Sun Chemical, Cincinnati, OH |
| Diazo Resin No. 4 | Benzenediazonium, 4-(phenylamino)sulfate (1:1), polymer with formaldehyde [CAS 41432-19-3]; Fairmount Chemical Co., Newark, NJ |

| GLOSSARY -continued | |
|---|---|
| Elvanol ® 50-42 | High viscosity polyvinyl alcohol, 87–89% hydrolyzed; E. I. du Pont de Nemours and Co., Wilmington, DE |
| Hardener No. 3 | Sodium 4,4'-Diazidostilbene-2,2'-disulfonate [CAS 2718-90-3]; Fairmount Chemical Co., Newark, NJ |
| Macol ® P 500 | Polypropylene glycol (MW 500) [CAS 5322-69-4]; PPG/Mazer Chemicals, Gurnee, IL |
| Magenta Pigment | Sunsperse ® 6000 Naphthol Red; Sun Chemical, Cincinnati, OH |
| PEOX ® 500 | Poly(2-ethyl-2-oxazoline) (MW 500,000); [CAS 25805-17-8]; Dow Chemical, Midland, MI |
| PVP K-90 | Polyvinyl pyrrolidone (MW 360,000); [CAS 9003-39-8]; GAF Corp., Wayne, NJ |
| SPP-H | Polyvinyl alcohol (degree of polymerization 1700, 88% hydrolysis) acetalized with 1.25 mol % N-methyl-4-(p-formyl styryl) pyridinium methosulfate; Toyo Gosei Kogyo Co., Ltd. Ichikawa City, Chiba Pref., Japan via Charkit Chemical Corporation, Darien, CT |
| Tamol ® 731 | Sodium salt of a polymeric carboxylic acid; Rohm & Haas, Philadelphia, PA |
| Vinac ® B-15 | Polyvinyl acetate beads (MW 90,000); Air Products, Allentown, PA |
| Vinol ® 165 | Airvol ®; High viscosity, greater than 99.3% hydrolyzed, polyvinyl alcohol; Air Products, Allentown, PA |
| Zonyl ® FSO-100 | Nonionic fluorosurfactant; E. I. du Pont de Nemours and Co., Wilmington, DE |

Example 1

A colored image on a support was prepared, using a photosensitive layer comprising a polymeric diazo resin, according to the following procedure. In this example toning precedes washout.

Step 1. Coating solution PVP K-90 (2.0 g) was dissolved in water (18.0 g) at room temperature. Carbowax® 200 (1.5 g) and Diazo Resin No. 4 (0.10 g) were dissolved in the aqueous PVP solution to produce the coating solution.

Step 2. Photosensitive Element The coating solution was board coated onto a support of about 25 micron thick polyethylene terephthalate film using a coating knife with a coating gap of about 18 microns. The coating was dried with a hot air gun to produce a photosensitive element consisting of the photosensitive layer and support. The coating weight was about 26 mg/dm$^2$.

Step 3. Exposure The photosensitive element was placed in a vacuum frame with the photosensitive layer up, i.e., facing the source of actinic radiation. A transparent polypropylene film about 18 microns thick was laid over the element. A negative separation transparency for magenta was placed on top of the polypropylene film with the emulsion side of the transparency in contact with the polypropylene film and the base side up. The polypropylene film was used to keep the separation from sticking to the photosensitive element. A vacuum was drawn on the element and separation transparency for about 90 sec prior to exposure. The element was exposed for about 90 sec with the radiation from a 5 kW high pressure mercury vapor lamp (Theimer Violux, Exposure Systems Company, Bridgeport, Conn., equipped with a photopolymer bulb and Kokomo filter) about 137 cm above the element and separation transparency. After exposure the separation transparency and polypropylene film were removed from the exposed photosensitive element.

Step 4. Toning and Washout The exposed element was hand toned using a cloth to apply magenta toner (negative magenta toner for the Cromalin® off-press color proofing system, E. I. du Pont de Nemours and Co., Wilmington, Del.). Excess toner was wiped off to obtain a uniformly colored element.

The element was subsequently washed with tap water by holding the colored element under a water stream to wash off the non-exposed areas of the photosensitive layer. After drying with a hot air gun, the element showed a sharp magenta-colored image with a color density of 1.1 and tonal range of 1–98% dots for a 150 lines/in (60 lines/cm) screen. Color density was measured with a MacBeth RD 918 reflection densitometer which measures the amount of light reflected by a solid image.

Example 2

A colored image on a substrate other than the support was prepared using a photosensitive layer comprising a polymeric diazo resin according to the following procedure. In this example toning precedes washout.

A photosensitive element, prepared as in Steps 1 and 2 of Example 1, was laminated to CR/1 receptor stock (E. I. du Pont de Nemours and Co., Wilmington, Del.). The support was removed to produce an element consisting of photosensitive layer and CR/1 receptor.

Exposure was carried out as described in Step 3 of Example 1. The exposed element was toned with magenta toner using an ATM II automatic toning machine (E. I. du Pont de Nemours and Co., Wilmington, Del.). The toned element was washed out and evaluated as described in Step 4 of Example 1. The resulting image had a color density of 1.4 and a tonal range of 0.5–97% dots.

Example 3

A colored image on a substrate other than the support was prepared using a photosensitive layer comprising a polymeric diazo resin according to the following procedure. In this example toning precedes washout.

Step 1. Coating Solution PVP K-90 (4.0 g) was dissolved in water (36.0 g) at room temperature. Carbowax® 200 (3.0 g), Diazo Resin No. 4 (0.20 g), and Zonyl® FSO-100 (0.04 g) were dissolved in the aqueous PVP solution to produce the coating solution.

Step 2. Photosensitive Element The coating solution was board coated onto a support of about 18 micron thick polypropylene film using a coating knife with a coating gap of about 18 microns. The coating was dried with a hot air gun to produce a photosensitive element consisting of the photosensitive layer and support. The coating weight was about 200 mg/dm$^2$.

Step 3. Exposure The photosensitive element was laminated to CR/1 receptor stock and the resulting element placed in a vacuum frame with the support up, i.e., facing the source of actinic radiation. A negative separation transparency for magenta was placed on top of the support with the emulsion side in contact with the support and the base side up. A vacuum was drawn on the element and separation transparency for 90 sec prior to exposure. The element was exposed for about 30 sec as described in Step 3 of Example 1. After exposure the separation transparency was removed.

Step 4. Toning and Washout The support was peeled from the exposed element. The revealed surface of the photosensitive layer was toned, developed, and evaluated as described in Example 2. A sharp, magenta-colored image with a color density of 1.2 and tonal range of 2–98% dots was obtained.

Example 4

A colored image on a support was prepared, using a photosensitive layer comprising a polymeric diazo resin, according to the following procedure. In this example washout precedes toning.

Step 1. Coating Solution PEOX® 500 (2.5 g) was dissolved in water (22.5 g) at room temperature. A 50% by weight aqueous solution of poly(vinyl methyl ether) (2.5 g) (Polysciences, Warrington, Pa.), Diazo Resin No. 4 (0.12 g), and Zonyl® FSO-100 (0.02 g) were dissolved in the resulting solution to produce the coating solution.

Step 2. Photosensitive Element The coating solution was board coated onto a support of about 50 micron thick photographic grade polyethylene terephthalate film using a coating knife with an 18 micron gap. The coating was dried with a hot air gun to produce a photosensitive element consisting of the photosensitive layer and support. The coating weight was about 26 mg/dm$^2$.

Step 3. Exposure The photosensitive element was exposed for about 30 sec as described in Step 3 of Example 1.

Step 4. Washout and Toning The exposed element was washed out with tap water and dried, as described in Step 4 of Example 1, to obtain a colorless image. The colorless image was toned with magenta toner using an ATM II as described in Example 2 and evaluated as described in Step 4 of Example i to obtain a magenta image with color density of 1.1 and tonal range of 0.5–90% dots.

Example 5

A multicolored image on a substrate other than the support was prepared using a photosensitive layer comprising a polymeric diazo resin according to the following procedure. In this example toning precedes washout.

Step 1. Coating Solution The coating solution was prepared as described in Step 1 of Example 3.

Step 2. Photosensitive Elements The coating solution was board coated onto (1) support of about 18 micron thick polypropylene film and (2) a support of about 18 micron thick silicone-treated polyethylene terephthalate film using a coating knife with an 18 micron gap. The coatings were dried with a hot air gun to produce photosensitive elements consisting of photosensitive layer and support. Coating weights were about 18 mg/dm$^2$ for the element on the polypropylene support and about 20 mg/dm$^2$ for the element on the polyethylene terephthalate support.

Step 3. Exposure The photosensitive element on polyethylene terephthalate support was laminated to CR/1 receptor stock and the resulting element placed in a vacuum frame with the support up, i.e., facing the source of actinic radiation. A negative color separation transparency for yellow was placed on top of the support with the emulsion side in contact with the support and the base side up. A vacuum was drawn on the element and separation transparency for 90 sec prior to exposure. The element was exposed for about 60 sec as described in Step 3 of Example 1.

Step 4. Yellow Image The support was peeled from the exposed element. The revealed surface of the photosensitive layer was toned with yellow toner and washed out as described in Example 2. A sharp, yellow image was obtained.

Step 5. Adhesive Layer The adhesive layer was prepared by coating Vinac® B-15 in ethyl acetate onto about 25 micron thick silicone-treated polyethylene terephthalate film. The coating weight was 61 mg/dm². The Vinac® B-15 layer was laminated onto the yellow image formed in Step 4 and the polyethylene terephthalate film removed to form an element consisting of receptor, yellow image, and adhesive layer.

Step 6. Two-color Image The photosensitive element on the polyethylene terephthalate support was laminated to the adhesive layer of the element formed in Step 5 to form an element consisting of: receptor, yellow image, adhesive layer, unexposed photosensitive layer, and polyethylene terephthalate support. The element was placed in a vacuum frame and exposed through a negative color separation transparency for magenta for about 90 sec as described in Step 3.

The support was peeled from the exposed element. The revealed surface of the photosensitive layer was toned with magenta toner and washed out as described in Step 4 to form a two-color image consisting of: receptor, yellow image, adhesive layer, and magenta image.

Step 7. Three-color Image Following the procedure of Step 5, an adhesive layer was laminated to the two-color image formed in Step 6. The photosensitive element on the polypropylene support was laminated to the element thus formed to form an element consisting of receptor, yellow image, adhesive layer, magenta image, adhesive layer, photosensitive layer, and polypropylene support. The element was placed in vacuum frame and exposed through a negative color separation transparency for cyan for about 90 sec as described in Step 3.

The support was peeled from the exposed element. The revealed surface of the photosensitive layer was toned with cyan toner and washed out as described in Step 4 to form a three-color image consisting of receptor, yellow image, adhesive layer, magenta image, adhesive layer, and cyan image.

Step 8. Four-color Image Step 7 was repeated using the photosensitive element on the polypropylene support except that (1) exposure was carried out through a negative color separation transparency for black for 120 sec and (2) toning was carried out with black toner. A four-color image was formed consisting of receptor, yellow image, adhesive layer, magenta image, adhesive layer, cyan image, adhesive layer, and black image.

Example 6

Multicolor images using elements in which the photosensitive layer comprises a polymeric diazo resin were prepared according to the following procedure:

Step 1. Coating Solution PVP K-90 (4.0 g) was dissolved in water (36.0 g) at room temperature. Macol® P 500 (1.0 g), Diazo Resin No. 4 (0.20 g), and Zonyl® FSO-100 (0.04 g) were dissolved in the aqueous PVP solution to produce the coating solution.

Step 2. Photosensitive Element The coating solution was board coated onto a support of about 25 micron thick silicone-treated polyethylene terephthalate film using a coating knife with a coating gap of about 18 microns. The coating was dried with a hot air gun to produce a photosensitive element consisting of the photosensitive layer and support. The coating weight was about 19 mg/dm².

Step 3. Exposure The Vinac® B-15 layer prepared in Example 5, Step 5, was laminated onto CR/1 receptor stock and the polyethylene terephthalate film removed to form an element consisting of receptor, and adhesive layer. The photosensitive element prepared in Step 2 was laminated onto the adhesive layer to form an element consisting of: receptor, adhesive layer, photosensitive layer, and polyethylene terephthalate support. The element was placed in a vacuum frame with the support up, i.e., facing the source of actinic radiation. A negative separation transparency for yellow was placed on top of the support with the emulsion side in contact with the support and the base side up. A vacuum was drawn on the element and separation transparency for 90 sec prior to exposure. The element was exposed for about 40 sec as described in Step 3 of Example 1.

Step 4. Yellow Image The support was peeled from the exposed element. The photosensitive layer was toned with yellow toner and washed out as described in Example 2. A sharp, yellow image was obtained.

Steps 5-8. Two-color, Three-color, and Four-color Images Following the procedures of Example 5, Steps 5-8, and using exposures of 25 sec for magenta, 40 sec for cyan and 50 sec for black, two-color, three-color, and four-color images were produced. The four-color image consisted of receptor, adhesive layer, yellow image, adhesive layer, magenta image, adhesive layer, cyan image, adhesive layer, and black image.

Example 7

A multicolor image using precolored films as colorants was prepared as follows:

Precolored films were prepared by mixing pigment (0.60 g) in 40.0 g of a 5% aqueous Vinol® 165 solution containing Tamol® 731 (0.02 g), coating the resulting solution onto about 25 micron thick polyethylene terephthalate film using a coating knife with an about 18 micron gap, and drying the coating with a hot air gun to produce a precolored film consisting of precolored layer and polyethylene terephthalate film. Magenta and cyan precolored films were prepared using magenta pigment and cyan pigment, respectively.

Photosensitive elements were prepared as described in Example 3, Steps 1 and 2. The photosensitive element was laminated to CR/1 receptor and exposed as described in Step 3 of Example 5. The magenta precolored film was laminated onto the exposed photosensitive layer to produce an element consisting of receptor, exposed photosensitive layer, precolored layer, and polyethylene terephthalate film. The polyethylene terephthalate film was removed. The element was sprayed with tap water and dried with a hot air gun to produce a magenta image.

The procedure of Example 6, Steps 5 and 6, was repeated to produce an element consisting of receptor, magenta image, adhesive layer, and exposed photosensitive layer. The exposed photosensitive layer was colored with the cyan color element, washed out, and dried as described above to produce a two-color image consisting of receptor, magenta image, adhesive layer, and cyan image.

Example 8

Examples 8-10 illustrate the preparation of a colored image using a photosensitive layer which comprises a bis-azide. In this example toning precedes washout.

Step 1. Coating solution PVP K-90 (4.0 g) was dissolved in water (36.0 g) and Carbowax® 200 (3.0 g) was added. Hardener No. 3 (0.20 g) was then dissolved in the aqueous solution to produce the coating solution.

Step 2. Photosensitive Element The coating solution was board coated onto a support of about 50 micron thick corona discharge treated photographic grade polyethylene terephthalate film using a coating knife with an 18 micron gap. The coating was dried with a hot air gun to produce a photosensitive element consisting of the photosensitive layer and support. The coating weight was about 24 mg/dm$^2$.

Step 3. Exposure The photosensitive element was placed in a vacuum frame with the support up, i.e., facing the source of actinic radiation. A negative separation transparency for magenta was placed on top of the support with the emulsion side of the transparency in contact with the support and the base side up. The element was exposed as described in Step 3 of Example 1.

Step 4. Toning The exposed element was toned as described in Example 2.

Step 5. Washout The toned element was washed out with tap water by holding the colored element under a water stream to wash off the non-exposed areas of the photosensitive layer. After drying with a hot air gun, the element showed a magenta-colored image with a color density of 1.8 and a tonal range of 10–97% dots for a lines/in (60 lines/cm) screen.

Example 9

A colored image was prepared, using a process in which toning precedes exposure and washout, as follows:

A tonable element prepared as described in Example 8, Steps 1 and 12, was toned as described in Example 8, Step 4. The toned element was then exposed as described in Example 1, Step 3. The exposed element was washed out and evaluated as described in Example 8, Step 5. The resulting image had a color density of 1.6 and a tonal range of 2–97% dots.

Example 10

A colored image on a substrate other than the support was prepared as follows:

The coating solution was prepared as described in Example 8, Steps 1 and 2, except that Zonyl® FSO-100 (0.02 g). was added to the coating solution (20.0 g). The coating solution was board coated onto a Support of about 18 micron thick polypropylene film using a coating knife with an 18 micron gap. The dried coating weight was about 17 mg/dm$^2$.

The photosensitive element was then laminated to CR/1 receptor stock. Exposure was carried out for about 20 sec as described in Example 8, Step 3. The support was removed to produce an element consisting of exposed photosensitive layer and CR/1 receptor. The exposed photosensitive layer was then toned, washed out and evaluated as described in Steps 4 and 5 of Example 8. The resulting image had a color density of 1.0 and a tonal range of 1–95% dots.

Example 11

Examples 11–14 illustrate the preparation of a colored image using a photosensitive element comprising a photocrosslinkable polymer. This example illustrates a process in which toning precedes washout.

A 13.1% by weight aqueous solution of SPP-H (19.1 g), 10% by weight aqueous solution of PVP K-90 (25.0 g), and 10.0 g of water were stirred together. Carbowax® 200 (3.75 g) was added and the resulting coating solution was stirred for 1 hr. The photosensitive element was prepared as described in Example 8, Step 2. The coating weight was about 24 mg/dm$^2$. Exposure, toning, and washout were carried out as described in Example 8 except that exposure was carried out for 50 sec. The resulting image had a color density of 0.8 and a tonal range of 2–97% dots.

Example 12

A colored image was prepared according to the following process. In this example, toning precedes exposure and washout.

The photosensitive element was prepared following the procedure of Example 11. The photosensitive layer coating weight was about 40 mg/dm$^2$. Exposure, toning, and washout were carried out as described in Example 9 except that exposure was carried out for 40 sec. The resulting image had a color density of 0.8 and a tonal range of 2–90% dots.

Example 13

The photosensitive element was prepared following the procedure of Example 11. The photosensitive layer coating weight was about 40 mg/dm$^2$. Exposure, toning, and washout were carried out as described in Example 10 except that exposure was carried out for 40 sec. The resulting image had a color density of 0.9 and a tonal range of 1–96% dots.

Example 14

A colored image on a support was prepared, using a photosensitive element comprising a photocrosslinkable polymer and a mixture of water soluble plasticizers, according to the following procedure:

A 13.1% by weight aqueous solution of SPP-H (19 g), 10% by weight aqueous solution of Elvanol® 50-42 (25 g), 50% by weight aqueous solution of poly(vinyl methyl ether) (3.8 g) (Polysciences, Warrington, Pa.), 1.9 g of Carbowax® 200 and 15 g of water were stirred together. The photosensitive element was prepared as described in Example 8, Step 2. Exposure, toning, and washout were carried out as described in Example 8, except that a 50 sec exposure was used. The resulting image had a color density of 0.6 and a tonal range of 1–98% dots.

Having described the invention, we now claim the following and their equivalents.

What is claimed is:

1. A process for forming a colored image comprising the steps of:
   (A) imagewise exposing a tonable photosensitive element comprising:
      (1) a support, and
      (2) a tonable, aqueous-processable photosensitive layer consisting essentially of:
         (a) an aqueous-processable, photoinsolubilizable, photosensitive composition comprising a photosensitive material and
         (b) a water-soluble plasticizer, wherein said photosensitive material is present in sufficient amount to insolubilize said photosensitive layer on exposure to actinic radiation, said photosensitive composition is present in sufficient amount for form a solid layer when said photosensitive layer is coated, and said plasticizer is present in sufficient amount to make said photosensitive layer tonable at room temperature before and after exposure to actinic radiation; said photosensitive material and plasticizer being present in admixture in said photosensitive layer;

(B) washing out the unexposed regions of the photosensitive layer with an aqueous solvent; and (C) applying a colorant to the photosensitive layer; wherein step (A) is carried out before step (B).

2. The process of claim 1 wherein step (C) is carried out after step (A) and before step (B).

3. The process of claim 1 further comprising the steps of:

(D) carrying out steps (A)–(C) to produce a first colored image;

(E) laminating an additional photosensitive element to the image formed in steps (A)–(C), said element comprising, in order (a) a support, (b) a photosensitive layer, and (c) an adhesive layer;

(F) removing said support from said additional photosensitive element;

(G) imagewise exposing said additional photosensitive element;

(H) washing out the unexposed regions of the photosensitive layer of said additional photosensitive element with an aqueous solvent;

(I) coloring the photosensitive layer of said additional photosensitive element by adding a colorant;

wherein (1) step (G) is carried out before step (H); (2) step (F) is carried out before steps (H) and (I), (3) the support of the additional photosensitive element is removable and transparent to actinic radiation if step (F) is carried out after step (G); and (4) steps (E)–(I) are carried out one or more times to produce a multicolored image.

4. The process of claim 3 wherein (a) step (C) is carried out after step (A) and before step (B), and (b) step (I) is carried out after step (G) and before step (H).

5. The process of claim 1 further comprising the steps of:

(D) carrying out steps (A)–(C) to produce a first colored image on a support;

(E) laminating said first colored image to a temporary receptor;

(F) removing the support from said first colored image to produce a colored image on said temporary receptor;

(G) carrying out steps (A)–(C) to produce an additional colored image;

(H) laminating in register said additional colored image to said previously formed colored image on said temporary receptor;

(I) removing the support from said additional colored image to produce a colored image on said temporary receptor;

(J) carrying out steps (G) and (I) one or more times to produce a multicolored image on said temporary receptor; and (K) laminating said multicolored image to a permanent receptor;

wherein (1) step (D) is carried out first, (2) step (E) is carried out before step (F), (2) step (G) is carried out before step (H), (3) steps (E)–(F) are carried out before step (H), (4) step (H) is carried out before step (I), and (5) step (K) is carried out last.

6. The process of claim 5 wherein one or more of the photosensitive elements comprise, in order, (a) said support, (b) an adhesive layer, and (c) said photosensitive layer.

7. The process of claim 5 wherein step (C) is carried out after step (A) and before step (B).

8. The process of claim 1,3, or 5 wherein the photoinsolubilizable composition further comprises an aqueous-processable binder and the photosensitive composition consists essentially of 30–70% by weight binder, 1–15% by weight photosensitive material, 30–70% plasticizer and 0–2% other ingredients.

9. The process of claim 1, 3, or 5 wherein the photoinsolubilizable composition consists essentially of 30–80% by weight photosensitive material, 30–70% plasticizer, and 0–2% other ingredients.

10. The process of claim 1 wherein said binder is selected from the group consisting of polyvinyl alcohol, polyethylene oxide, poly(2-ethyl-2-oxazoline), and polyvinyl pyrrolidone.

11. The process of claim 1 wherein said plasticizer is selected from the group consisting of polyethylene glycol, polypropylene glycol, and poly(vinyl methyl ether).

12. The process of claim 1, 3, or 5 wherein the photosensitive material is selected from the group consisting of (a) photosensitive, aqueous-processable polymeric diazo resins; (b) photosensitive, aqueous-processable bis-azides; and (c) photosensitive, aqueous-processable derivatives of polyvinyl alcohol wherein said polyvinyl alcohol derivatives comprise photocrosslinkable groups.

13. The process of claim 12 wherein the photosensitive material is selected from the group consisting of (a) the zinc chloride complex of the 4-(phenylamino)-benzenediazonium sulfate (1:1) formaldehyde polymer, the zinc chloride complex of the 4-(phenylamino)-benzenediazonium phosphate (1:1) formaldehyde polymer, the cobalt chloride complex of the 4-(phenylamino)-benzenediazonium (1:1) formaldehyde polymer, the uncomplexed 4-(phenylamino)-benzenediazonium phosphate (1:1) formaldehyde polymer, and the uncomplexed 4-(phenylamino)-benzenediazonium sulfate (1:1) formaldehyde polymer, (b) sodium 4,4'-diazidostilbene-2,2'-disulfonate, sodium 4,4'-diazidobenzalacetophenone-2-sulfonate, and sodium 4,4'-diazidostilbene-alpha-carboxylate, and (c) polyvinyl alcohol derivatives wherein said photocrosslinkable groups are selected from the group consisting of N-alkyl styrylpyridinium or N-alkyl styrylquinolinium.

14. The process of claim 13 wherein the photosensitive material is selected from the group consisting of (a) the uncomplexed 4-(phenylamino)-benzenediazonium phosphate (1:1) formaldehyde polymer, and the uncomplexed 4-(phenylamino)-benzenediazonium sulfate (1:1) formaldehyde polymer; (b) sodium 4,4'-diazidostilbene-2,2'-disulfonate; and (c) polyvinyl alcohol derivatives wherein said photocrosslinkable groups are N-alkyl styrylpyridinium.

* * * * *